United States Patent
Benwadih et al.

(10) Patent No.: US 10,629,981 B2
(45) Date of Patent: Apr. 21, 2020

(54) METHOD FOR PRODUCING VIAS ON FLEXIBLE SUBSTRATE

(71) Applicant: COMMISSARIAT A L'ENERGIE ATOMIQUE ET AUX ENERGIES ALTERNATIVES, Paris (FR)

(72) Inventors: Mohammed Benwadih, Champigny sur Marne (FR); Olivier Haon, Saint Etienne de Crossey (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 246 days.

(21) Appl. No.: 15/816,004

(22) Filed: Nov. 17, 2017

(65) Prior Publication Data

US 2018/0145396 A1    May 24, 2018

(30) Foreign Application Priority Data

Nov. 21, 2016    (FR) ..................... 16 61300

(51) Int. Cl.

| | | |
|---|---|---|
| *H01L 21/48* | (2006.01) | |
| *H01Q 1/12* | (2006.01) | |
| *H01L 23/498* | (2006.01) | |
| *H05K 1/18* | (2006.01) | |
| *H01Q 23/00* | (2006.01) | |

(52) U.S. Cl.
CPC ............. *H01Q 1/12* (2013.01); *H01L 21/486* (2013.01); *H01L 21/4867* (2013.01); *H01L 23/49827* (2013.01); *H05K 1/181* (2013.01); *H05K 1/189* (2013.01); *H01L 23/4985* (2013.01); *H01Q 23/00* (2013.01)

(58) Field of Classification Search
CPC ... H01L 21/302; H01L 21/306; H01L 21/486; H01L 21/4867; H01L 23/49827; H01L 23/4985; H05K 3/0055; H05K 3/12; H05K 3/42; H05K 1/181; H05K 1/189; H01Q 1/12; H01Q 23/00
See application file for complete search history.

(56) References Cited

U.S. PATENT DOCUMENTS

2004/0061234 A1    4/2004    Shah et al.

FOREIGN PATENT DOCUMENTS

| EP | 1 035 581 A2 | | 9/2000 |
|---|---|---|---|
| JP | 103369837 B | * | 4/2016 |
| WO | 2006058034 A2 | * | 6/2006 |
| WO | WO 2006/061589 A1 | | 6/2006 |

OTHER PUBLICATIONS

French Preliminary Search Report dated Jul. 7, 2017 in French Application 16 61300, filed Nov. 21, 2016 (with English Translation of Categories of cited documents).

* cited by examiner

*Primary Examiner* — Carl J Arbes
(74) *Attorney, Agent, or Firm* — Oblon, McClelland, Maier & Neustadt, L.L.P.

(57) ABSTRACT

Method for producing a connection structure passing through a flexible substrate, in particular a plastic substrate, comprising:
  producing a hole passing through the thickness of the substrate,
  depositing in the hole a first conductive ink having a first viscosity, so as to form a conductive layer on at least one wall of the hole,
  depositing in the hole a second conductive ink having a second viscosity greater than the first viscosity, so as to fill the hole.

11 Claims, 2 Drawing Sheets

METHOD FOR PRODUCING VIAS ON FLEXIBLE SUBSTRATE

TECHNICAL FIELD AND PRIOR ART

The present application pertains to the field of circuits produced on a flexible or supple support, in particular those formed on a plastic substrate.

More specifically, it relates to an improved method for producing an interconnection structure passing through the thickness of a flexible support and applies notably within the context of the manufacture of circuits, in particular RF and/or electronic circuits, on such types of supports.

To form a conductive element passing through the thickness of a substrate, it is known to produce a hole using a plasma or a laser or a chemical etching through the opening of a masking, then to fill this hole using a conductive material. In the field of circuits produced on a flexible support made of elastic, notably polymer, material, a conductive material in the form of liquid conductive ink is typically used to form connections.

In such devices, the filling of the holes by the liquid conductive ink may pose a problem. When the substrate has an high thickness this filling generally proves to be incomplete, which can lead to the implementation of conductive elements of inhomogeneous transversal section and which sometimes do not entirely pass through the thickness of the substrate and thus do not emerge on both faces of the support.

The problem is posed of finding a novel method for producing interconnections on flexible support and which is improved vis-à-vis the aforementioned drawbacks.

DESCRIPTION OF THE INVENTION

The present invention relates to the improved production of a connection structure for flexible or supple substrate.

According to one embodiment, it relates to a method comprising:

producing one or more holes passing through the thickness of the substrate, depositing in the hole or the holes a first conductive liquid having a first viscosity, depositing in the hole a second conductive liquid having a second viscosity greater than the first viscosity.

The first conductive liquid and the second conductive liquid are typically conductive inks.

The first conductive liquid has a first viscosity, in particular a low viscosity in order to form a layer on the wall or the walls of the hole or holes. This conductive layer is intended to form a conductive sheath or peripheral conductive portion of conductive elements passing through the substrate. The first viscosity is typically comprised between 0.2 and 100 mPa·s, preferably between 10 and 30 mPa·s.

The second conductive liquid has a second viscosity greater than the first viscosity, in particular a high viscosity in order to make it possible to fill the hole or the holes and to form a conductive central portion of the through conductive element(s). The second viscosity is typically comprised between 100 and 200,000 mPa·s, advantageously between 1000 and 40,000 mPa·s.

The second conductive liquid and the first conductive liquid are preferably chosen such that the second viscosity is at least 10 times greater than the first viscosity and advantageously between 50 and 100 times greater than the first viscosity to fill holes of diameter less than 100 μm. The ratio between the second viscosity and the first viscosity may be provided to be of the order of 1000 for holes to fill which have a diameter greater than 500 μm.

The filling in two stages with liquids or inks of different viscosities makes it possible to avoid blocking the hole or the holes by the conductive ink and to allow the conductive element(s) to pass through the entire thickness of the substrate.

This also makes it possible to form an interconnection structure with improved conductance.

The flexible or supple substrate is made of an elastic material. "Elastic" is taken to mean a material having a Young's modulus comprised between $10^{-3}$ GPa and 5 GPa and preferably at least 20 times lower than that of silicon.

Typically, the elastic material is polymer based.

After formation of the hole or the holes and prior to the deposition of the first conductive ink, a treatment of the wall of the hole may be carried out so as to increase its wettability vis-à-vis the first conductive ink.

This treatment may comprise the formation of a self-assembled monolayer SAM in contact with the wall of the hole.

The self-assembled monolayer (SAM) may comprise thiol groups to favour the adhesion of the first ink on the wall(s) of the hole(s).

The self-assembled monolayer SAM may comprise silane, amine, or isocyanate groups to favour the adhesion of the mono-layer on the wall(s) of the hole(s), in particular when said wall is made of polymer.

When the substrate is made of polymer material, the formation of the SAM layer may be preceded by a treatment so as to form hydroxyl groups on the polymer.

This makes it possible to favour the adherence of the SAM layer on the wall of the hole.

The hole or the holes may be produced so as to pass through the first conductive zone and the second conductive zone. This makes it possible to facilitate the contact pick up on the lower or upper face of the substrate.

Prior to the formation of the hole or the holes, at least one encapsulation layer is formed on the first conductive zone and/or on the second conductive zone, the hole or the holes being formed through the encapsulation layer. This or these encapsulation layers may serve as masking to the conductive filling liquid(s) in order to protect the face of the substrate on the side of which the filling takes place and to avoid the conductive liquid or the conductive ink being deposited on undesired regions of the device.

Advantageously, the hole or the holes is or are produced by mechanical drilling. This makes it possible not to damage the walls of the holes and thereby to favour subsequently the later treatment of these walls to make it possible to improve their wettability.

Advantageously the method applies to the implementation of interconnection structures for a device produced on flexible support and comprising at least one antenna. The first conductive zone may thereby be a zone of the antenna circuit whereas the second conductive zone may be a zone of a ground plane arranged on the rear face of the substrate and forming an electromagnetic reflector.

BRIEF DESCRIPTION OF THE DRAWINGS

The present invention will be better understood on reading the description of exemplary embodiments given for purely illustrative purposes and in no way limiting, and by referring to the appended drawings, among which.

Identical, similar or equivalent parts of the different figures bear the same numerical references so as to make it easier to go from one figure to the next.

The different parts represented in the figures are not necessarily according to a uniform scale, in order to make the figures more legible.

Moreover, in the following description, terms that depend on the orientation of a structure, such as "front", "rear", "upper", "lower", "lateral", etc., apply in considering that the structure is oriented in the manner illustrated in the figures.

DETAILED DESCRIPTION OF PARTICULAR EMBODIMENTS

An example of method for producing an interconnection structure on flexible support, as implemented according to the present invention, will now be given in relation with FIGS. 1A-1H.

In this example, the structure that is produced serves to establish an electrical connection between a ground plane and an antenna circuit provided respectively on a first face of the support and a second face of the support opposite to the first face.

The starting support (FIG. 1A) may be a supple or flexible substrate 1, in particular of rigidity less than that of substrates normally used in microelectronics. The flexible substrate is made of an elastic material typically based on polymer material(s) such as for example polycarbonate (PC), polyethylene (PE), polyimide (PI). The substrate 1 has a thickness e which may be comprised for example between 10 µm and 7 mm, preferably greater than 50 µm. According to a particular example, a flexible substrate made of polycarbonate of thickness of the order of 250 µm and 175 µm is used.

Figure 1A:
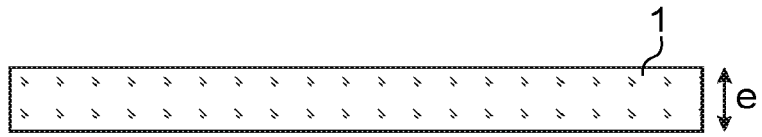
FIGS. 1A-1H illustrate an example of method for producing a connection structure passing through a flexible substrate and provided to connect an antenna circuit to a ground plane.
Figure 1B:
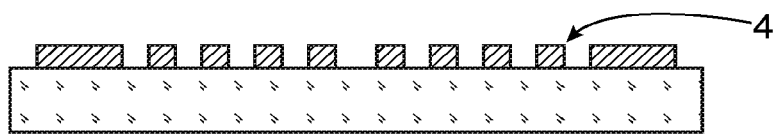
Figure 1C:
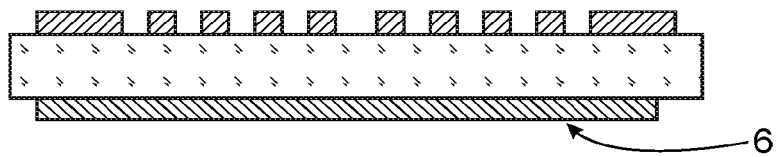
Figure 1D:
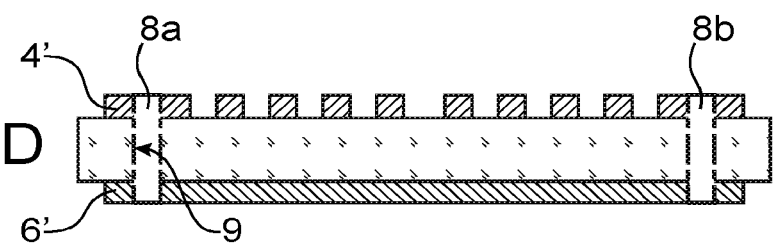

Firstly, on an upper face of the substrate 1, also referred to as "front face", a series of conductive tracks 4 forming an antenna circuit (FIG. 1B) is formed. On a lower face of the substrate 1, also referred to as "rear face", and which is opposite to the front face, at least one conductive zone 6, referred to as "ground plane", is also formed (FIG. 1C). This conductive zone 6 serves as reference for the electrical potentials of the antenna circuit and may also fulfill the function of electromagnetic reflector.

The conductive tracks 4 and the conductive zone 6 may be produced by depositing at least one conductive liquid ink for example by means of the screen printing technique, or by ink jet. The conductive ink typically comprises a solvent, a binder and conductive particles, for example metal, and based on Ag or Ni or Au, or Cu or Pd or Pt.

One or more holes 8a, 8b passing through the thickness of the substrate 1 are next produced. In the example illustrated in FIG. 1D, the holes 8a, 8b are formed so as each to pass through at least one conductive track 4' of the upper face and as well as at least one conductive portion 6' of the ground plane.

The holes 8a, 8b may have a width W (smallest dimension measured in a plane parallel to the plane [0; x; y] of the reference system [0; x; y; z], the plane [0; x; y] being itself parallel to the upper face of the second layer) comprised for example between 1 and 500 µm and a height H (dimension measured parallel to the z axis) corresponding to the thickness of the substrate. H is comprised for example between 1 and 7 mm, and is for example of the order of 175 µm or 250 µm in the case of a polycarbonate substrate as mentioned previously. The through holes 8a, 8b may thereby be produced with an aspect ratio W/H comprised for example between 10 and $10^{-4}$.

In the case of a substrate 1 made of polymer material, a chemical etching may prove to be difficult to implement, in particular in the case where the polymer is polycarbonate. Etching methods by laser or by plasma may prove long to implement and bring about a deterioration of the walls of the holes when the substrate 1 is made of polymer material.

In order to avoid the aforementioned problems, the etching of the holes 8a, 8b may be carried out mechanically, typically using a drill provided with micro-drill bits of diameter of the order of one to several micrometres or tens of micrometres. For example, a drill bit of 50 µm, or 80 µm, or 100 µm, or 150 µm, or 250 µm diameter may be employed. The mechanical drilling of the holes 8a, 8b makes it possible not to damage their walls 9 which extend through the entire thickness of the substrate 1.

The drill used may be connected to a digital control unit or to a control circuit making it possible to control the movement of the drill bit as a function of positional data or coordinates determined as a function of the layout of the device in which the interconnection structure is produced. In this example, the positional data are established as a function of the positioning of elements of the antenna circuit and the ground plane.

After formation of the holes 8a, 8b and prior to their filling to form conductive elements, one or several steps of treatment of the walls 9 of the holes 8a, 8b are advantageously carried out so as to increase their wettability vis-à-vis the conductive filling liquids intended to be deposited in the holes, in particular inks comprising conductive, typically metal, particles.

Figure 1E:
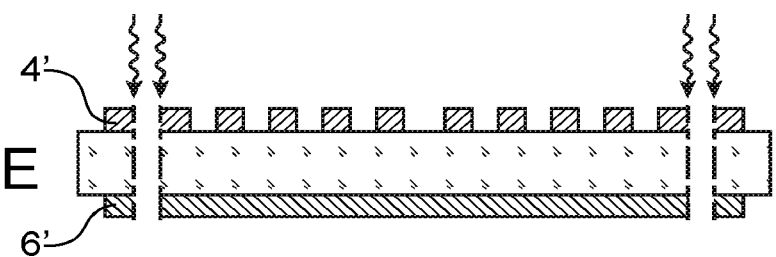

A first treatment may be provided so as to form hydroxyl (—OH) groups on the respective walls 9 of the holes. This may be carried out by plasma, for example of RIE type under oxygen $O_2$ with a pressure comprised between 10 and 150 mTorr, a power comprised for example between 20 and 200 Watt, for a duration that may be provided between 1 and 10 minutes. Preferably, this first treatment is carried out by means of a surface treatment equipment using UV radiation and an ozone atmosphere. The duration of exposure to the UV radiation may be for example comprised between 20 and 600 seconds (FIG. 1E). It is also possible to carry out such a treatment using an aqueous solution, for example of $NaBH_4$ in water type.

Figure 1F:
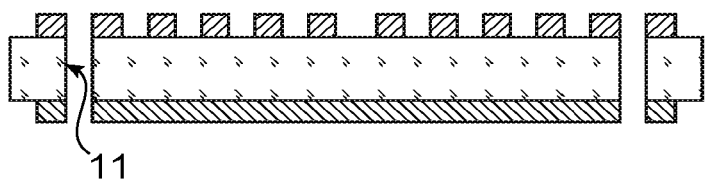

A second treatment may next be provided so as to form a SAM (Self Assembled Monolayer) 11 on the walls 9 of the holes 8a, 8b in order to increase the adherence, at the level of the walls, of conductive inks that have been deposited in the holes 8a, 8b (FIG. 1F).

The SAM layer typically comprises silane or amine or isocyanate type groups in order to make it possible to make this layer adhere to the material of the substrate 1 made of polymer(s). In order to make it possible to improve the capillarity of the conductive liquid on the walls of the holes 8a, 8b, the SAM layer 11 also typically comprises thiol type groups, in particular when the conductive liquid that has been deposited is a conductive ink based on particles of Ag or Cu or Ni.

The SAM layer 11 may be for example a layer of 4-nitrobenzenethiol or (3-mercaptopropyl) trimethoxysilane.

Figure 1G:
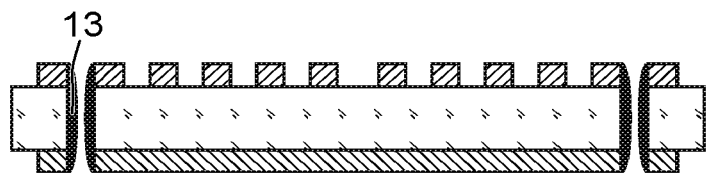
Figure 1H:
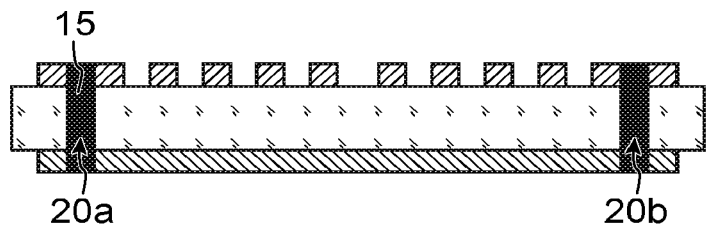

A thin conductive layer is next formed on the walls 9 of the holes 8a, 8b, by deposition of a conductive liquid, in particular a conductive ink 13 (FIG. 1G). This conductive ink 13 has a low viscosity which may be comprised for example between 0.2 and 100 centipoises (i.e. mPa·s), preferably between 10 and 30 mPa·s.

The conductive ink 13 may be based on metal particles selected for example from Ag, Ni, Au, Cu, Pd, Pt in a solvent. According to a particular example, a conductive ink 13 is employed based on nanoparticles of silver, for example of the order of 20% maximum by weight, diluted in an alcohol of "Cabot Conductive Ink CCI-300" type sold by the CABOT Corporation having a viscosity comprised between 11 and 15 cP. Another commercially available ink may also be used as conductive ink based on nanoparticles of silver 13 sold by the Advanced Nano Products ANP Company DGP 40LT-15. Such an ink has a viscosity which may be of the order of 13 cP and may be diluted in a solvent of triethylene glycol monoethyl ether type, the concentration by weight of silver being able to be comprised between 30 and 35%.

A thermal annealing, for example at a temperature of the order of 60° C. for 1 minute is next carried out followed by an annealing at 100° C. for 5 minutes in order to dry the ink and form a thin conductive layer on the walls 9.

Next, another conductive ink 15, this time having a higher viscosity than that of the conductive ink 13 (FIG. 1H), is deposited in the holes 8a, 8c.

The other conductive ink 15, more viscous, typically has a viscosity comprised between 100 and 200,000 centipoise cP (i.e. mPa·s), preferably between 5,000 and 40,000 mPa·s. The other conductive ink 15 may also be based on metal particles selected for example from Ag, Ni, Au, Cu, Pd, Pt and contain a thickener such as for example cellulose. According to a particular example, a conductive ink 15 of LOCTITE® ECI 1006 E&C type sold by the Henkel Company or also the ink HPS021 or FG32 sold by the NOVACENTRIX Company is used.

The use of a more viscous ink 15 this time enables filling of the central part of the holes 8a, 8b. Conductive elements are thereby formed. A thermal annealing, for example at a temperature of the order of 130° C. for 30 minutes is next carried out in order to dry the ink 15 and form a conductive central portion in the holes 8a, 8b.

By carrying out the filling of the holes 8a, 8b in two stages using firstly a fluid ink 13 then an ink 15 of higher viscosity, a more homogeneous distribution of conductive material in the holes 8a, 8b, and better filling of said holes, is obtained.

Conductive elements 20a, 20b passing through the thickness of the substrate 1 are thereby formed, each in contact with a conductive portion 4' of the antenna circuit arranged on the upper face and a conductive zone 6' arranged on the lower face.

The conductive elements 20a, 20b making it possible to establish a connection between the lower face and upper face of the substrate 1 have a homogeneous transversal section and improved conductance.

According to an alternative of the production method described previously, it is possible to provide to form an encapsulation layer on the upper face and/or on the lower face of the substrate 1.

Figure 2A:
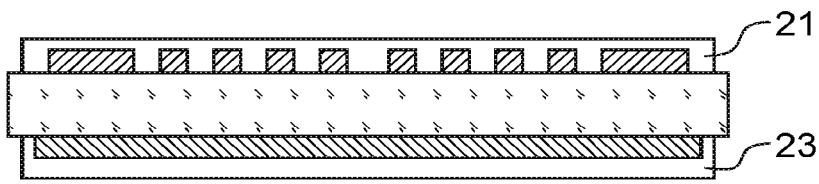
FIGS. 2A-2D illustrate an alternative embodiment of the method.

In the example illustrated in FIG. 2A, prior to the production of the holes, on the upper face of the substrate 1 a first encapsulation layer 21 is formed making it possible to ensure a protection of the antenna circuit, whereas a second encapsulation layer 23 is deposited on the lower face of the substrate 1, and makes it possible to protect the ground plane.

The encapsulation layers 21, 23 may be based on a polymer, for example a polyimide and may have adhesive properties, such as for example Kapton®.

Advantageously, the encapsulation layers are based on fluoropolymer.

Figure 2B:
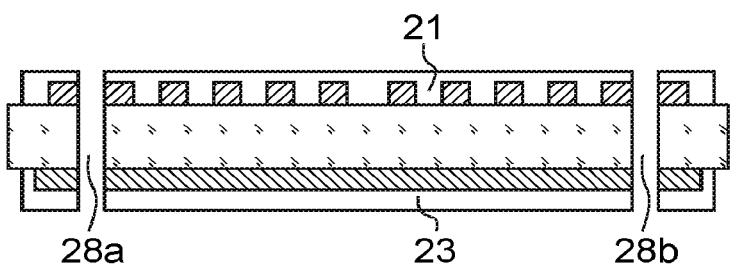

Next, holes 28a, 28b are formed passing through the encapsulation layers 21, 23 and the thickness of the substrate 1 (FIG. 2B). This may be carried out for example by means of drilling as described previously in relation with FIG. 1D.

Figure 2C:
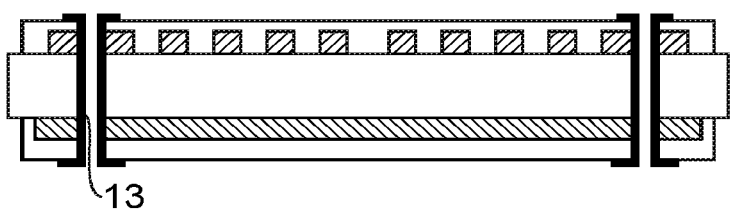

Then, after having preferably carried out a surface preparation of the walls of the holes 28a, 28b of the type described previously in relation with the FIGS. 1E-1F, a first deposition of conductive ink 13 of low viscosity (FIG. 2C) is carried out, so as to form a sheath or peripheral conductive zone of conductive elements on the lateral wall of the holes 28a, 28b.

During this deposition, the encapsulation layers 21, 23 serve as protective mask to prevent an untimely deposition of conductive ink 13 on undesired zones of the upper face and the lower face of the substrate 1. In this way, the conductive ink is prevented from spreading on the antenna circuit or the ground plane, which could lead to, as the case may be, the formation of a short-circuit. Advantageously, the encapsulation layer 21 is based on a fluoropolymer type polymer making it possible to favour the dewetting of the conductive ink 13 on the upper face and the substrate 1. This contributes to better filling of conductive ink 13 in the holes 28a, 28b.

Figure 2D:
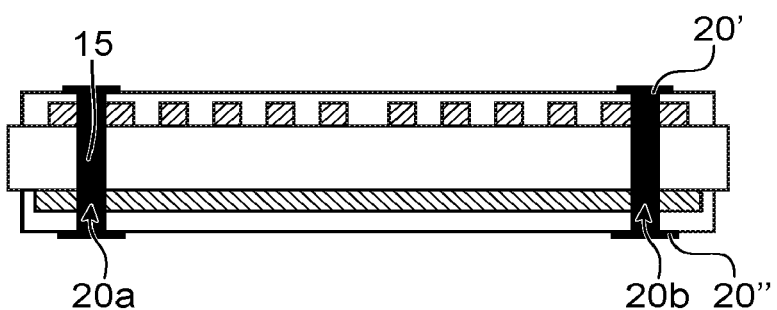

Next, a deposition is carried out of the other conductive ink 15 of greater viscosity than that of the conductive ink 13 (FIG. 2D). This other filling makes it possible to form a central conductive portion of the conductive elements 20a, 20b passing through the substrate 1.

Figure 3:
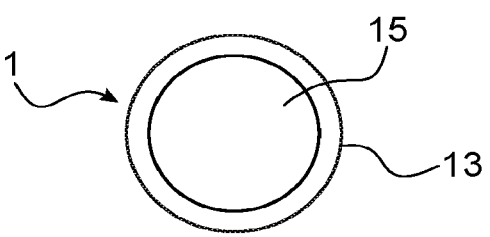
FIG. 3 illustrates a conductive element layout having a central portion formed of a first ink and a peripheral portion formed of a second conductive ink of viscosity lower than that of the first ink.

A layout with a central conductive portion formed of the viscous conductive ink 15 and a sheath formed of the less viscous conductive ink 13 is illustrated in FIG. 3, which gives a sectional view of a conductive element formed through the flexible substrate 1.

In order to enable an easier contact pick up, the conductive elements 20a, 20b may comprise one or more conductive regions 20', 20" extending respectively over the encapsulation layers 21, 23 without however creating a short-circuit.

In one or the other of the examples of methods that have been described, an interconnection structure for an antenna circuit is created. A method according to the invention may also apply to the implementation of devices provided with other types of electronic circuit on flexible support.

The invention claimed is:

1. A method for producing a connection structure passing through a flexible substrate to connect at least a first conductive zone arranged on a first face of the substrate and at least a second conductive zone arranged on a second face of the substrate, comprising:
   producing at least a hole passing through the thickness of a flexible substrate;
   depositing in the hole a first conductive ink having a first viscosity comprised between 0.2 and 100 mPa·s, so as to form a conductive layer on a wall of the hole, the conductive layer forming a peripheral conductive portion of a conductive element;

depositing in the hole a second conductive ink (having a second viscosity greater than the first viscosity and comprised between 100 and 200,000 mPa·s, so as to produce a central conductive portion of the conductive element;

the method comprising, after formation of the hole and prior to the deposition of the first conductive ink, a treatment of the wall of the hole so as to increase its wettability vis-à-vis the first conductive ink;

wherein the first and the second conductive inks each comprise a solvent, a binder, and conductive particles.

2. The method according to claim 1, wherein the treatment comprises the formation of a self-assembled monolayer SAM in contact with the wall of the hole.

3. The method according to claim 2, wherein the substrate is made of polymer material and the first ink is based on metal particles, the self-assembled monolayer SAM comprising thiol groups to favour the adhesion of the first ink, the self-assembled monolayer SAM comprising silane, amine, isocyanate groups to favour the adhesion of the mono-layer on the polymer material of the substrate.

4. The method according to claim 2, wherein the substrate is made of polymer material, the formation of the monolayer being preceded by a treatment so as to form hydroxyl functions on the polymer.

5. The method according to claim 1, wherein said hole is produced so as to pass through the first conductive zone and the second conductive zone.

6. The method according to claim 1, wherein prior to the formation of said hole, at least one encapsulation layer is formed on the first conductive zone and/or on the second conductive zone, said hole being formed through the encapsulation layer.

7. The method according to claim 1, wherein said hole is produced by mechanical drilling.

8. The method according to claim 1, wherein the first viscosity is comprised between 10 and 30 mPa·s, the second viscosity is comprised between 1,000 and 40,000 mPa·s and the second viscosity is at least 10 times greater than the first viscosity.

9. The method according to claim 1, wherein the first conductive zone is a zone of an antenna circuit arranged on the front face of the substrate, the second conductive zone being a zone of a ground plane arranged on the rear face of the substrate and forming a reflector.

10. A method for producing a connection structure passing through a flexible substrate to connect at least a first conductive zone arranged on a first face of the substrate and at least a second conductive zone arranged on a second face of the substrate, comprising:

producing at least a hole passing through the thickness of a flexible substrate;

depositing in the hole a first conductive ink having a first viscosity, so as to form a conductive layer on a wall of the hole, the conductive layer forming a peripheral conductive portion of a conductive element;

depositing in the hole a second conductive ink having a second viscosity greater than the first viscosity, so as to produce a central conductive portion of the conductive element;

the method comprising, after formation of the hole and prior to the deposition of the first conductive ink, a treatment of the wall of the hole so as to increase its wettability vis-à-vis the first conductive ink, wherein prior to the formation of said hole, at least one encapsulation layer is formed on the first conductive zone and/or on the second conductive zone, said hole being formed through the encapsulation layer.

11. A method for producing a connection structure passing through a flexible substrate to connect at least a first conductive zone arranged on a first face of the substrate and at least a second conductive zone arranged on a second face of the substrate, comprising:

producing at least a hole passing through the thickness of a flexible substrate;

depositing in the hole a first conductive ink having a first viscosity, so as to form a conductive layer on a wall of the hole, the conductive layer forming a peripheral conductive portion of a conductive element;

depositing in the hole a second conductive ink having a second viscosity greater than the first viscosity, so as to produce a central conductive portion of the conductive element;

the method comprising, after formation of the hole and prior to the deposition of the first conductive ink, a treatment of the wall of the hole so as to increase its wettability vis-à-vis the first conductive ink, wherein the first conductive zone is a zone of an antenna circuit arranged on the front face of the substrate, the second conductive zone being a zone of a ground plane arranged on the rear face of the substrate and forming a reflector.

* * * * *